United States Patent
Mishima et al.

(10) Patent No.: US 6,818,325 B2
(45) Date of Patent: *Nov. 16, 2004

(54) LIGHT-EMITTING DEVICE

(75) Inventors: Masayuki Mishima, Kanagawa (JP);
Hisashi Okada, Kanagawa (JP);
Katsumi Araki, Kanagawa (JP);
Xuepeng Qiu, Kanagawa (JP);
Toshihiro Ise, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 103 days.

This patent is subject to a terminal disclaimer.

(21) Appl. No.: 09/987,639

(22) Filed: Nov. 15, 2001

(65) Prior Publication Data
US 2002/0096995 A1 Jul. 25, 2002

(30) Foreign Application Priority Data
Nov. 16, 2000 (JP) .................................. P. 2000-350170

(51) Int. Cl.[7] .............................................. H05B 33/12
(52) U.S. Cl. ........................ 428/690; 428/917; 313/504; 313/506
(58) Field of Search ............................... 428/690, 917; 313/504, 506; 257/102, 103

(56) References Cited

U.S. PATENT DOCUMENTS 6,097,147 A    8/2000  Baldo et al. ................. 313/506
6,461,747 B1 * 10/2002 Okada et al. ................. 428/690
2002/0024293 A1 * 2/2002 Igarashi et al. .............. 313/483
2002/0028329 A1 * 3/2002 Ise et al. ..................... 428/336
2002/0113545 A1 * 8/2002 Adachi et al. ............... 313/504
2002/0182441 A1 * 12/2002 Lamansky et al. ........... 428/690

OTHER PUBLICATIONS

Tang et al, "Organic Electroluminescent Diodes", Applied Physics Letters, vol. 51, pp. 913–915 (Sep. 1987).

Baldo et al, "Very High–Efficiency Green Organic Light–Emitting Devices Based on Electrophosphorescence", Applied Physics Letters, vol. 75, pp. 4–6 (July 1999).

* cited by examiner

Primary Examiner—Marie Yamnitzky
(74) Attorney, Agent, or Firm—Sughrue Mion, PLLC

(57) ABSTRACT

A light-emitting device comprising: a pair of electrodes formed on a substrate; and organic compound layers provided in between the electrodes, wherein the organic compound layers comprises a light-emitting layer comprising a hole-transporting material and a phosphorescent compound and an electron-transporting layer comprising an electron-transporting material, and an ionization potential of the electron-transporting material is 5.9 eV or more or wherein the organic compound layers comprises a hole-transporting layer comprising a hole-transporting material, a light-emitting layer comprising a phosphorescent compound and an electron-transporting layer comprising an electron-transporting material, and an ionization potential of the electron-transporting material is 5.9 eV or more.

16 Claims, No Drawings

LIGHT-EMITTING DEVICE

FIELD OF THE INVENTION

This invention relates to a material for use in an organic electroluminescent light-emitting device (hereinafter referred to as "light-emitting device") and a light-emitting device, which can preferably be utilized as a display element or as a plane light source for a full-color display, a back light or plane illumination, or as a light source array in a printer.

BACKGROUND OF THE INVENTION

Light-emitting devices seem to have a bright prospect as solid, light-emitting inexpensive devices for large-area full color displays or as light source arrays for recording, and many developments have been made on them. The light-emitting devices are generally constituted by a light-emitting layer interleaved between a pair of opposed electrodes. Light emission is a phenomenon which occurs when electrons and holes respectively injected from the cathode and the anode upon application of an electric field across the electrodes are recombined in the light-emitting layer and their energy level returns from conduction band to valence band with emitting the energy as light.

Many organic light-emitting devices having formed therein an organic thin film have so far been reported (see references described in Macromolecular Symposium, vol.125, p.1, 1997). These light-emitting devices, however, involve the problem that their light-emitting efficiency is extremely lower than that of inorganic LED devices or fluorescent tubes. It is known that conventional light-emitting devices have generally required a high driving voltage, while with providing a low light-emitting luminance and a low light-emitting efficiency. In recent years, however, various techniques have been reported to solve the problems. For example, there has been proposed an organic light-emitting device having an organic thin film formed by vapor deposition of an organic compound (Applied Physics Letters, vol.51, p.913, 1987). The organic light-emitting device described there has a laminated two-layered structure of an electron-transporting layer comprising an electron-transporting material and a hole-transporting layer comprising a hole-transporting material, and shows a markedly improved light-emitting performance in comparison with conventional single-layered devices. This light-emitting device uses a low molecular amine compound as a hole-transporting material and an aluminum (Al) complex of 8-quinolinol (hereinafter abbreviated as "Alq") as an electron-transporting and light-emitting material, with the color of emitted light being green.

Most of the at present proposed light-emitting devices contain fluorescence-emitting compound as a light-emitting material in a light-emitting layer and utilize fluorescent light emission obtained from singlet excitons of the compound. According to the knowledge of quantum chemistry, the ratio of singlet excitons generating fluorescence to triplet excitons generating phosphorescence in number is 1:3. Hence, as long as fluoresence is utilized, only 25% of the generated excitons can be effectively utilized, thus light-emitting efficiency is unavoidably low. On the other hand, if phosphorescence obtained from the triplet excitons can be utilized, it serves to improve light-emitting efficiency.

Thus, a phosphorescent device using an iridium-phenylpyridine complex has recently been reported (Applied Physics Letter, vol.75, p.4, 1999; Japanese Journal of Applied Physics, vol.38, p.L1502, 1999). In these reports, the light-emitting devices are reported to show light-emitting efficiency 2 to 3 times as much as that of conventional fluorescence-utilizing light-emitting devices. However, their light-emitting efficiency is still lower than theoretical limit of light-emitting efficiency, and much more improvement of light-emitting efficiency has been demanded.

In addition to the above-described problems, conventional processes for producing light-emitting devices involve serious problems of deterioration due to crystallization of a low molecular compound, high production cost, and poor productivity, since they are dry filming processes by deposition. Thus, in order to reduce the production cost or to apply to production of large-area devices, there have been reported light-emitting devices formed by filming a high-molecular compound according to a wet filming process. As such high-molecular compound, there are illustrated poly-p-phenylenevinylene capable of emitting green light (Nature, vol.347, p.539, 1990), poly(3-alkylthiophene) capable of emitting reddish orange light (Japanese Journal of Applied Physics, vol.30, p.L1938, 1991), and polyalkylfluorene as blue light-emitting device (Japanese Journal of Applied Physics, vol.30, p.L1941, 1991). In addition, in Japanese Patent Laid-Open No. 223188/1990, it is reported to disperse a low molecular compound in a binder resin and coat the dispersion in a wet manner to form a film. However, all of these techniques utilize fluorescence obtained from singlet exitons, and hence involve the essential problem of low light-emitting efficiency.

Light-emitting devices utilizing triplet exitons and formed by a wet filming process have not been reported at all. Organic light-emitting devices which show a high light-emitting efficiency and a high light-emitting luminance, which can be produced at a low production cost, and which can be made into a large-area device have not so far been developed, and have been eagerly desired.

SUMMARY OF THE INVENTION

The present invention has been made for solving the problem with the related art and attaining the following objects. That is, the invention provides a light-emitting device, which has a laminated two- or three-organic layer structure, which has an electron-transporting material having a specified minimum excitation triplet energy level, ionization potential and electron mobility, which shows an excellent light-emitting efficiency and light-emitting luminance utilizing a phosphorescent compound, in which at least one of the organic compound layers is formed by a wet filming method, and which permits to produce large-area displays at a reduced production cost.

The above-described object of the invention can be solved by the following light-emitting devices of the invention.

(1) A light-emitting device comprising: a pair of electrodes formed on a substrate; and organic compound layers provided in between the electrodes, wherein the organic compound layers comprise a light-emitting layer comprising a hole-transporting material and a phosphorescent compound and an electron-transporting layer comprising an electron-transporting material, and an ionization potential of the electron-transporting material is 5.9 eV or more.

(2) The light-emitting device as described in (1), wherein a minimum excitation triplet energy level of the electron-transporting material is from 60 kcal/mol to 90 kcal/mol.

(3) The light-emitting device as described in (1) or (2), wherein an electron mobility of the electron-transporting material is $1\times10^{-4}$ $cm^2 \cdot V^{-1} \cdot s^{-1}$ or more in an electric field of $1\times10^5$ $V \cdot cm^{-1}$.

(4) The light-emitting device as described in one of (1) to (3), wherein the electron-transporting material is an aromatic heterocyclic compound comprising a hetero atom.

(5) The light-emitting device as described in one of (1) to (4), wherein the electron-transporting material is an aromatic heterocyclic compound which has an azole skelton.

(6) The light-emitting device as described in one of (1) to (5), wherein the electron-transporting material is at least one of an aromatic heterocyclic compound which has a condensed azole skelton and an aromatic heterocyclic compound which has a triazine skelton.

(7) The light-emitting device as described in one of (1) to (6), wherein the electron-transporting material is an aromatic heterocyclic compound which has an condensed imidazopyridine.

(8) The light-emitting device as described in one of (1) to (7), wherein the content of the electron-transporting material is from 20 to 100% by weight based on the total content of the electron-transporting layer.

(9) The light-emitting device as described in one of (1) to (8), wherein at least one of the organic compound layers is formed by a coating method.

(10) The light-emitting device as described in one of (1) to (9), wherein the phosphorescent compound comprises one of orthometallated metal complex and porphyrin metal complex.

(11) The light-emitting device as described in (10), wherein the orthometallated metal complex comprises one of rhodium, platinum, gold, iridium, ruthenium and palladium.

(12) The light-emitting device as described in one of (1) to (11), wherein the content of the phosphorescent compound is from 0.1 to 70% by weight based on the total content of the light-emitting layer.

(13) A light-emitting device comprising: a pair of electrodes formed on a substrate; and organic compound layers provided in between the electrodes, wherein the organic compound layers comprises a hole-transporting layer comprising a hole-transporting material, a light-emitting layer comprising a phosphorescent compound and an electron-transporting layer comprising an electron-transporting material, and an ionization potential of the electron-transporting material is 5.9 eV or more.

(14) The light-emitting device as described in (13), wherein a minimum excitation triplet energy level of the electron-transporting material is from 60 kcal/mol to 90 kcal/mol.

(15) The light-emitting device as described in (13) or (14), wherein an electron mobility of the electron-transporting material is $1\times10^{-4}$ cm$^2\cdot$V$^{-1}\cdot$s$^{-1}$ or more in an electric field of $1\times10^5$ V$\cdot$cm$^{-1}$.

(16) The light-emitting device as described in one of (13) to (15), wherein the electron-transporting material is an aromatic heterocyclic compound comprising a hetero atom.

(17) The light-emitting device as described in one of (13) to (16), wherein the electron-transporting material is an aromatic heterocyclic compound which has an azole skelton.

(18) The light-emitting device as described in one of (13) to (17), wherein the electron-transporting material is at least one of an aromatic heterocyclic compound which has a condensed azole skelton and an aromatic heterocyclic compound which has a triazine skelton.

(19) The light-emitting device as described in one of (13) to (18), wherein the electron-transporting material is an aromatic heterocyclic compound which has a condensed imidazopyridine.

(20) The light-emitting device as described in one of (13) to (19), wherein the content of the electron-transporting material is from 20 to 100% by weight based on the total content of the electron-transporting layer.

(21) The light-emitting device as described in one of (13) to (20), wherein at least one of the organic compound layers is formed by a coating method.

(22) The light-emitting device as described in one of (13) to (21), wherein the phosphorescent compound comprises one of orthometallated metal complex and porphyrin metal complex.

(23) The light-emitting device as described in (22), wherein the orthometallated metal complex comprises one of rhodium, platinum, gold, iridium, ruthenium and palladium.

(24) The light-emitting device as described in one of (13) to (23), wherein the content of the phosphorescent compound is from 0.1 to 70% by weight based on the total content of the light-emitting layer.

DETAILED DESCRIPTION OF THE INVENTION

The invention is described in detail below. Additionally, in the invention, numeral A "to" numeral B means a range from numeral A to numeral B including both numeral A and numeral B as a minimum and a maximum, respectively.

The light-emitting device of the invention comprises a substrate having laminated thereon a transparent electrode, organic compound layers, a back side and, if necessary, a protective layer or other layer. Additionally, examples of compounds for forming these layers are described in, for example, "Yuki EL Display", a separate book of "Gekkan Display", No.10, 1998 (published by Techno Times).

In the invention, the organic compound layers comprise at least two layers of a light-emitting layer and an electron-transporting layer, or at least three layers of a hole-transporting layer, a light-emitting layer and an electron-transporting layer and, if necessary, a hole injecting layer, a hole-transporting layer, an electron injecting layer, etc.

The light-emitting layer contains at least one of hole-transporting materials and phosphorescent compound and, further, may contain a host compound. In addition, the layer may contain, if necessary, properly selected polymer binders or other components.

As the hole-transporting material, any of low molecular or high molecular hole-transporting materials which exert one of the function of injecting holes from the anode, the function of transporting holes and the function of blocking electron injected from the cathode may be used with no limitations. For example, there are illustrated the following materials: carbazole, triazole, oxazole, oxadiazole, imidazole, polyarylalkane, pyrazoline, pyrazolone, phenylenediamine, arylamine, amino-substituted chalcone, styrylanthracene, fluorenone, hydrazone, stilbene, silazane, poly(N-vinylcarbazole), and derivatives of these compounds; aromatic tertiary amine compounds, styrylamine compounds, aromatic dimethylidene compounds, porphyrin compounds, polysilane compounds, aniline copolymers, thiophene oligomers and conductive high molecular oligomers such as polythiophene; and high molecular compounds such as polythiophene, polyphenylene, polyphenylenevinylene, polyfluorene, and derivatives thereof. These hole-transporting materials may be used independently or as a mixture of two or more of them.

Content of the hole-transporting material in the light-emitting layer is preferably 30 to 99.9% by weight inclusive, and content of the hole-transporting material in the hole-transporting layer is preferably 30 to 100% by weight inclusive, which are properly determined depending upon characteristic properties or required performance. In case where the content of the hole-transporting material in the light-emitting layer or the hole-transporting layer is outside the scope described above, there results a reduced hole-transporting power, possibly leading to an increase in the driving voltage.

In the invention, light-emitting efficiency of the light-emitting device is improved by using a phosphorescent compound in the light-emitting layer. The phosphorescent compound means a compound which can emit light from triplet exciton and, though not limitative, it is preferred to incorporate at least one of orthometallated metal complexes and porphyrin metal complexes capable of emitting phosphorescence in the light-emitting layer.

The term "orthometallated complexes" is a general term for a group of compounds described in, for example, "Yuki Kinzoku Kagaku-Kiso to Oyo-", p.150 and p.232 (published by Shokabo-Sha in 1982) and "Photochemistry and Photophysics of Coordination Compounds" written by H. Yersin (published by Springer-Verlag Co. in 1987). An organic compound layer containing the orthometallated metal complex is advantageous in its highly bright luminescence and excellent light-emitting efficiency.

As a central metal of the metal complex, any of transition metals may be used. In the invention, however, rhodium, platinum, gold, iridium, ruthenium and palladium are preferably used. Of these, iridium is more preferred. Specific descriptions and examples of the orthometallated metal complexes are given in Japanese Patent Application No. 254171/2000, paragraphs 0152 to 0180.

Ligands capable of forming the orthometallated metal complexes include various ones as described in the above literature and, as preferred ligands, there are illustrated 2-phenylpyridine derivatives, 7,8-benzoquinoline derivatives, 2-(2-thienyl)pyridine derivatives, 2-(1-naphthyl)pyridine derivatives and 2-phenylquinoline derivatives. These derivatives may have a substituent or substituents when necessary. The orthometallated metal complexes may contain other ligands than the above-described ligands.

The orthometallated metal complexes to be used in the invention may be synthesized according to various known processes described in, for example, Inorg. Chem. 1991, No.30, p.1685; ibid., 1988, No.27, p.3464; ibid., 1994, No.33, p.545; Inorg. Chim. Acta, 1991, No.181, p.245; J. Organomet. Chem., 1987, No.335, p.293; and J. Am. Chem. Soc., 1985, No.107, p.1431.

Of the orthometallated complexes, those capable of emitting light from triplet exitons are preferably used in the invention in view of improvement of light-emitting efficiency.

Porphyrin metal complexes may be incorporated as phosphorescent compounds in the light-emitting layer. As the porphyrin metal complex, porphyrin platinum complex is preferred to use.

The phosphorescent compounds may be used independently or in combination with two or more of them. Content of the phosphorescent compound in the light-emitting layer is not particularly limited and may properly be selected depending upon the end use. For example, the content is 0.1 to 70% by weight, preferably 1 to 20% by weight. In case where the content of the phosphorescent compound is outside the scope of 0.1 to 70% by weight, there might result insufficient effect of the compound whereas, in case where the content is 1 to 20% by weight, the compound can sufficiently exhibit its effect.

The host compound is a compound which has the function of making a phosphorescent compound emit light through energy transfer from its excited state to the phosphorescent compound. As the host compound, any compound may be used without limitations that can transfer energy of exciton to the light-emitting material, and a proper one can be selected depending upon the end use. Specific examples thereof include:

carbazole, triazole, oxazole, oxadiazole, imidazole, polyarylalkane, pyrazoline, pyrazolone, phenylenediamine, arylamine, amino-substituted chalcone, styrylanthracene, fluorenone, hydrazone, stilbene, silazane, anthraquinodimethane, anthrone, diphenylquinone, thiopyrane dioxide, carbodiimide, fluorenylidenemethane, distyrylpyrazine, phthalocyanine, and derivatives of these compounds;

aromatic tertiary amine compounds, styrylamine compounds, aromatic dimethylidene compounds, porphyrin compounds, heterocyclic tetracarboxylic acid anhydrides such as naphthaleneperylene, metal complexes of 8-quinolinol derivatives or metal phthalocyanine, various metal complexes represented by metal complexes containing benzoxazole or benzothiazole as ligand, and polysilane compounds;

conductive high molecular oligomers such as poly(N-vinylcarbazole) derivatives, aniline copolymers, thiophene oligomers and polythiophene; and high molecular compounds such as polythiophene, polyphenylene, polyphenylenevinylene, polyfluorene, and derivatives of these compounds.

These host compounds may be used independently or in combination of two or more of them.

In the invention, electrically inert polymer binders may be used in the light-emitting layer as the case demands. As the polymer binder, there may be illustrated, for example, polyvinyl chloride, polycarbonate, polystyrene, polymethyl methacrylate, polybutylmethacrylate, polyester, polysulfone, polyphenylene oxide, polybutadiene, hydrocarbon resin, ketone resin, phenoxy resin, polyamide, ethyl cellulose, polyvinyl acetate, ABS resin, polyurethane, melamine resin, unsaturated polyester, alkyd resin, epoxy resin, silicone resin, polyvinyl butyral and polyvinyl acetal. Use of the polymer binder in the light-emitting layer is advantageous in that the light-emitting layer can be formed with ease and a large area by coating according to a wet filming method.

In the case of forming the light-emitting layer according to the wet filming method, the solvent to be used for preparing a coating solution is not particularly limited, and may properly be selected depending upon kinds of the hole-transporting material, orthometallated complex, host material, polymer binder, etc. For example, there are illustrated halogen-containing solvents such as chloroform, carbon tetrachloride, dichloromethane, 1,2-dichloroethane and chlorobenzene, ketonic solvents such as acetone, methyl ethyl ketone, diethyl ketone, n-propyl methyl ketone cyclohexanone, aromatic solvents such as benzene, toluene and xylene, ester solvents such as ethyl acetate, n-propyl acetate, n-butyl acetate, methyl propionate, ethyl propionate, gamma-butyrolactone and diethyl carbonate, etheric solvents such as tetrahydrofuran and dioxane, amidic solvents such as dimethylformamide and dimethylacetamide, dimethylsulfoxide and water.

Additionally, content of solids based on the solvent in the coating solution is not particularly limited, and viscosity of the solution is properly selected with no limitations depending upon the wet filming method employed.

In the invention, the light-emitting layer may be formed as a laminate together with a hole injecting layer. As the material for the hole injecting layer, those which can permit injection of holes from a transparent electrode or block electrons injected from a back side electrode may be used. For example, there are illustrated p-type semiconductors or p-type conductive high polymers. These materials are advantageous in that they permit to increase thickness of a light-emitting device with scarcely increasing driving voltage and can avoid luminescence unevenness and short-circuit.

Thickness of the light-emitting layer is preferably 10 to 200 nm, more preferably 20 to 80 nm. In case where the thickness exceeds 200 nm, driving voltage might increase whereas, in case where it is less than 10 nm, the light-emitting device might undergo short-circuit. Thickness of the hole-injecting layer is preferably about 5 to 1000 nm, more preferably 10 to 500 nm.

In the case of forming the hole injecting layer by coating according to the wet filming method, solvents to be used upon preparing a coating solution by dissolving materials of the hole injecting layer are not particularly limited as long as they do not dissolve out components of the light-emitting layer components, and there are illustrated the same solvents as those used for preparing a coating solution of the light-emitting layer. Additionally, content of solids based on the solvent in the coating solution is not particularly limited, and viscosity of the solution is properly selected with no limitations depending upon the wet filming method employed.

The electron-transporting layer contains at least an electron-transporting material and, if necessary, properly selected components such as a polymer binder. As the electron-transporting material, any of those which exert either of the function of transporting electrons and the function of blocking holes injected from the anode may be used with no limitations. For example, there are illustrated the following:

triazole, oxazole, oxadiazole, fluorenone, anthraquinodimethane, anthrone, diphenylquinone, thiopyran dioxide, carbodiimide, fluorenylidenemethane, distyrylpyrazine, phthalocyanine, and derivatives of these compounds;

heterocyclic tetracarboxylic acid anhydrides such as naphthaleneperylene, various metal complexes exemplified by metal complexes of 8-quinolinol derivatives, metal phthalocyanine, or metal complexes containing as a ligand benzoxazole or benzothiazole, electrically conductive high molecular oligomers such as aniline copolymers, thiophene oligomers and polythiophene; and high molecular compounds such as polythiophene, polyphenylene, polyphenylenevinylene, polyfluorene and derivatives of these compounds.

The electron-transporting materials may be used independently or in combination of two or more of them. Content of the electron-transporting material in the electron-transporting layer is preferably 20 to 100% by weight. In case where content of the electron-transporting material is outside the scope of 20 to 100% by weight, there might result a decreased electron-transporting ability, leading to an increase in driving volt.

Minimum excitation triplet energy level of the electron-transporting material is preferably 60 kcal/mol to 90 kcal/mol, more preferably 62 kcal/mol to 85 kcal/mol, still more preferably 65 kcal/mol to 80 kcal/mol. In case where the minimum excitation triplet energy level is outside the scope, triplet excitons generated within the light-emitting layer might be trapped by the electron-transporting material, leading to reduction in light-emitting luminescence and light-emitting efficiency. The minimum excitation triplet energy level can be determined from a build-up wavelength of phosphorescence measured in a state of solution or thin film cooled to a temperature of liquid nitrogen.

Ionization potential of the electron-transporting material is preferably 5.9 eV or higher, more preferably 6.0 eV or higher, still more preferably 6.2 eV or higher. Electron-transporting materials having such ionization potential can confine holes within the light-emitting layer, which is advantageous in that holes and electrons injected from the electron-transporting layer can effectively be recombined to generate excitons, thus a high luminance and a high light-emitting efficiency being obtained. Ionization potential of the electron-transporting material can be measured by any method, for example, by means of a UV photo-electron analyzer AC-1 (made by Riken Keiki K.K.) in the atmosphere.

In view of driving volt, electron mobility of the electron-transporting material is preferably $1\times10^{-4}$ $cm^2 \cdot V^{-1} \cdot s^{-1}$ or more, more preferably $2\times10^{-4}$ $cm^2 \cdot V^{-1} \cdot s^{-1}$ or more, still more preferably $4\times10^{-4}$ $cm^2 \cdot V^{-1} \cdot s^{-1}$ or more, in an electric field of $1\times10^5$ $V \cdot cm^{-1}$. Electron-transporting materials having such electron mobility are capable of well adjusting charge balance of holes and electrons in the light-emitting layer and can generate excitons with a high efficiency in the light-emitting layer, thus being advantageous in that they provide a high luminance and a high light-emitting efficiency. Electron mobility of the electron-transporting material may be measured by any method. For example, a thin film of a sample is subjected to measurement by a time-of-flight (TOF) method. As to the TOF method, reference may be made to Synth. Met., 111/112, (2000), p.331.

As the electron-transporting material, aromatic heterocyclic compounds having one or more hetero atoms in the molecule are preferably used. As specific examples of the electron-transporting material, those compounds are preferred which have an azole skeleton.

The compounds having an azole skeleton are compounds having two or more atoms other than carbon atoms and hydrogen atoms in the fundamental skeleton, which may be of a single ring or a condensed ring. The heterocyclic skeleton contains preferably 2 or more atoms selected from among N, O and S atoms, and, more preferably, is an aromatic hetero ring containing at least one N atom with in the skeleton and, still more preferably, is an aromatic hetero ring containing 2 or more N atoms within the skeleton. The hetero atoms may be at condensation positions or non-condensation positions. Preferred examples of the heterocyclic skeleton having 2 or more hetero atoms include pyrazole, imidazole, pyrazine, pyrimidine, indazole, purine, phthalazine, naphthyridine, quinoxaline, quinazoline, cinnoline, pteridine, perimidine, phenanthroline, pyrroloimidazole, pyrrolotriazole, pyrazoloimidazole, pyrazolotriazole, pyrazolopyrimidine, pyrazolotriazine, imidazoimidazole, imidazopyridazine, imidazopyridine, imidazopyrazine, triazolopyridine, benzimidazole, napthimidazole, benzoxazole, naphthoxazole, benzothiazole, naphthothiazole, benzotriazole, tetrazaindene and triazine.

Of these, compounds having a condensed azole skeleton such as imidazopyridazine, imidazopyridine, imidazopyrazine, benzimidazole, naphthimidazole, benzoxazole, naphthoxazole, benzothiazole and naphthothiazole and compounds having a triazine skeleton are more preferred as the electron-transporting material, with condensed imidazopyridine being still more preferred.

Preferred compounds having an azole skeleton are those which are represented by the following formula (I):

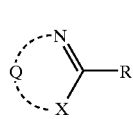
(I)

wherein R represents a hydrogen atom or a substituent, X represents O, S or N—Ra (wherein Ra represents a hydrogen atom, an aliphatic hydrocarbyl group, an aryl group or a heterocyclic group), Q represents atoms necessary for forming a hetero ring together with N and X and, if possible, R and X, or R and Q may be bound to each other to form a ring.

Specific examples of the electron-transporting material to be used in the invention are shown below which, however, are not to be construed as limiting the invention.

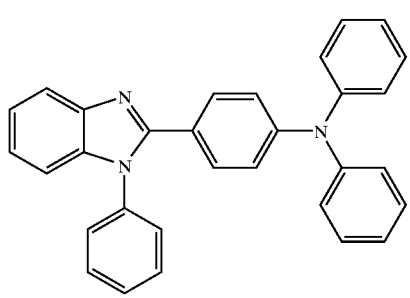
(1)

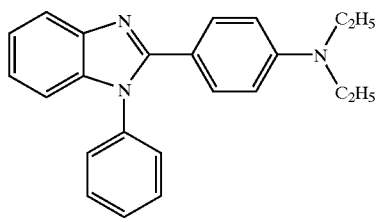
(2)

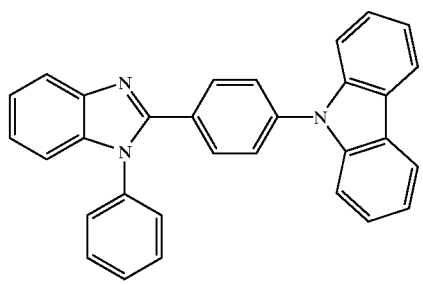
(3)

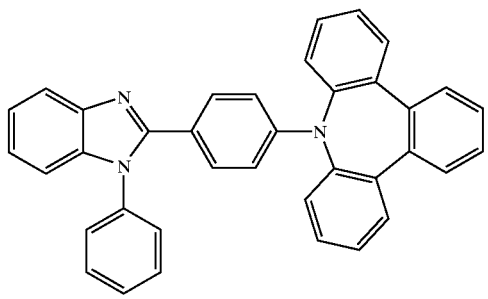
(4)

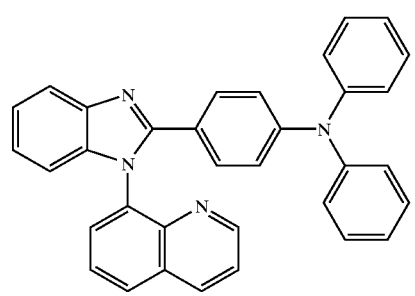
(5)

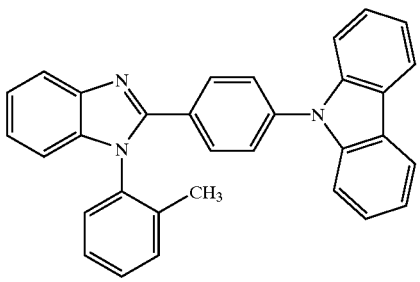
(6)

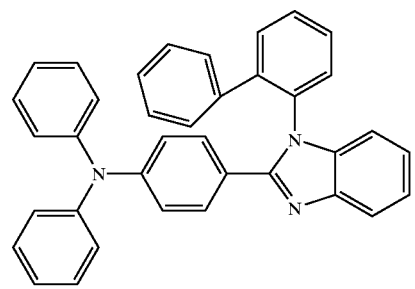
(7)

(8)
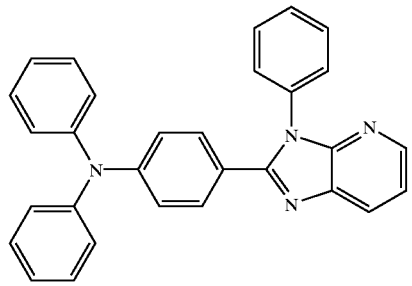
(9)
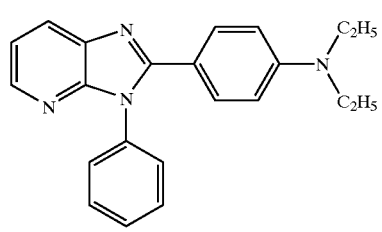
(10)
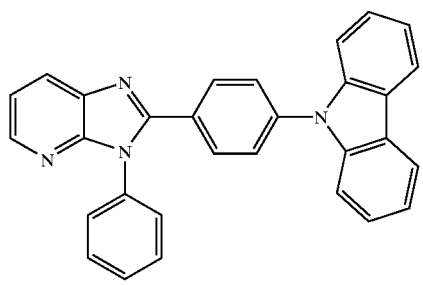
(11)
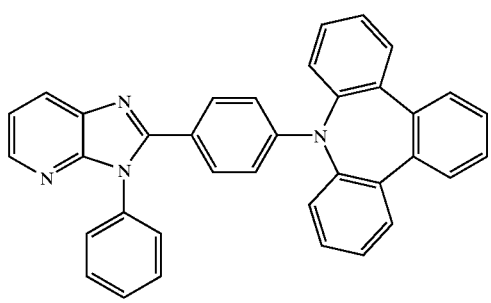
(12)
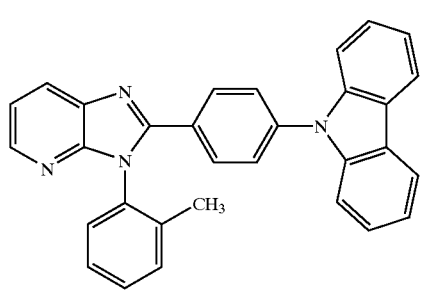
(13)
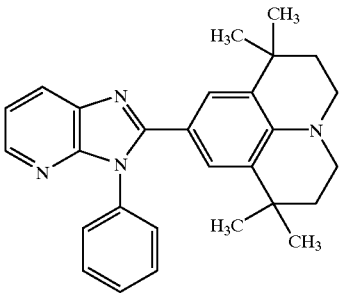
(14)
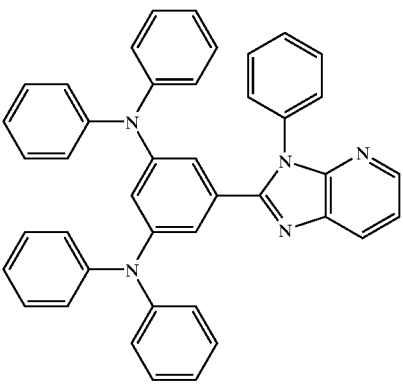
(15)
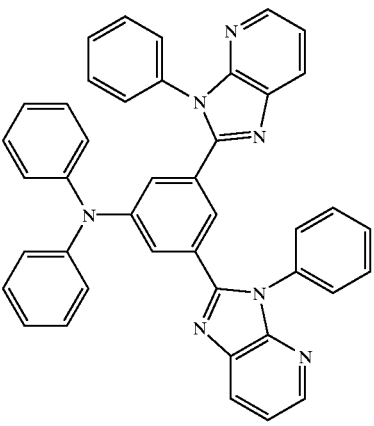
(16)
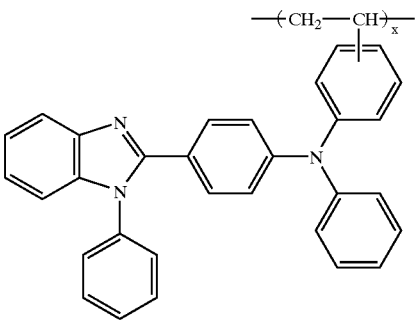

(17)
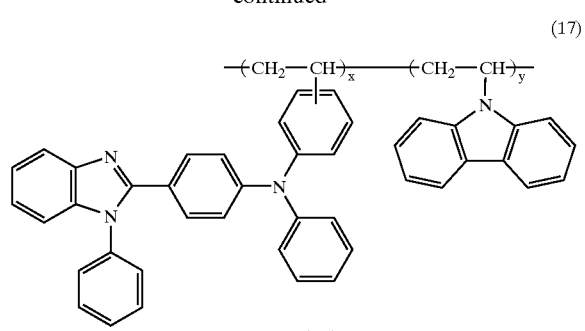
x:y = 50:50
(mole fraction)
(18)
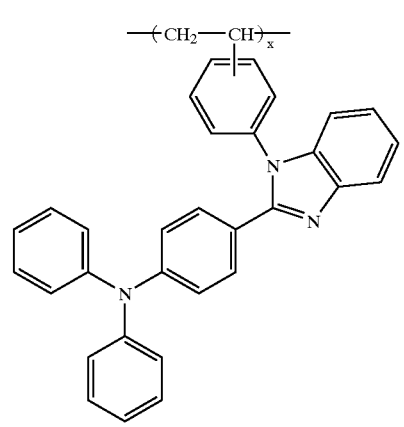
(19)
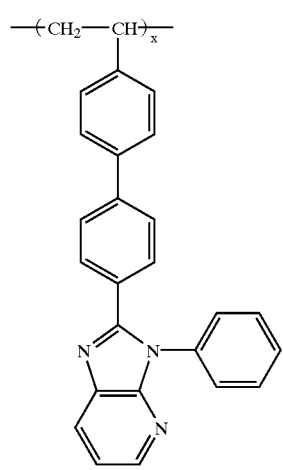
(20)
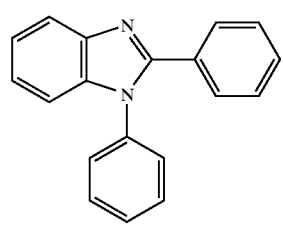
(21)
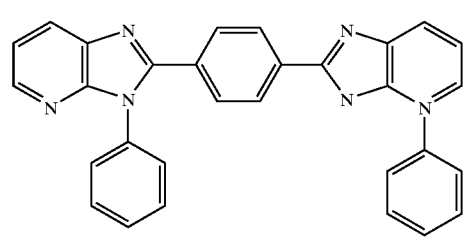
(22)
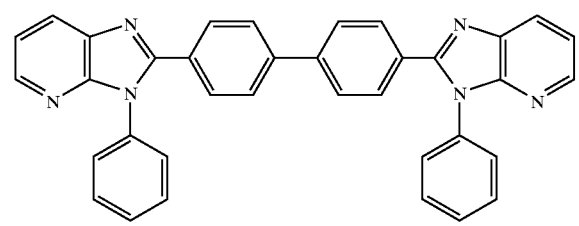
(23)
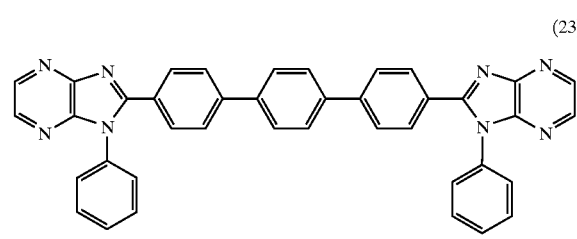
(24)
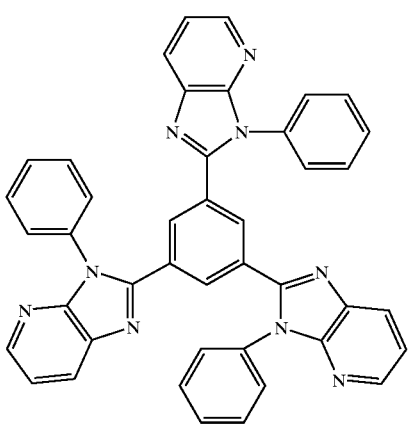
(25)
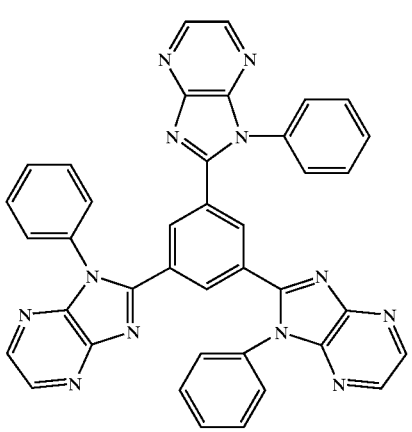

(26)
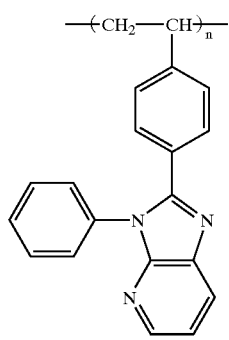
(27)
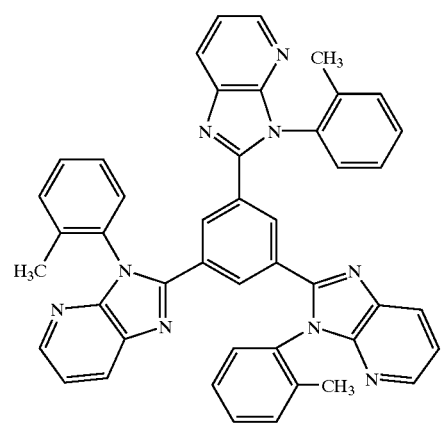
(28)
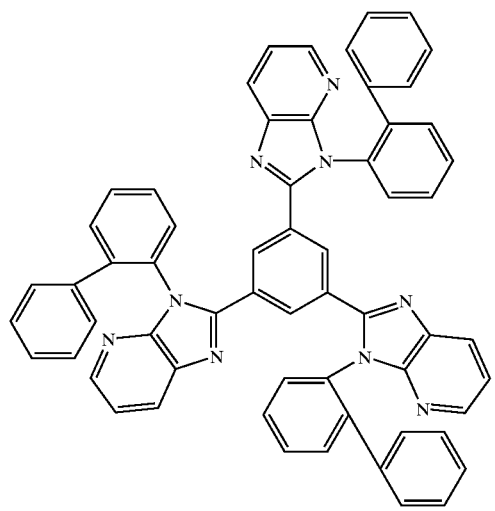
(29)
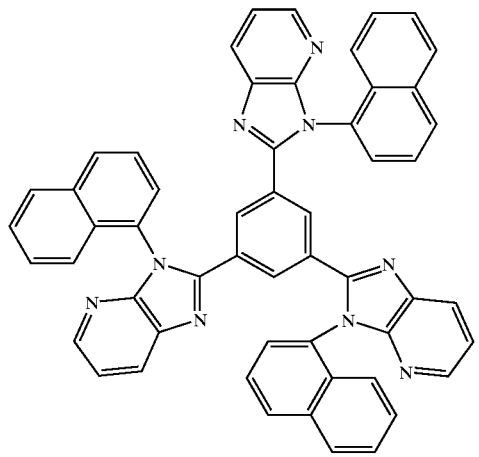
(30)
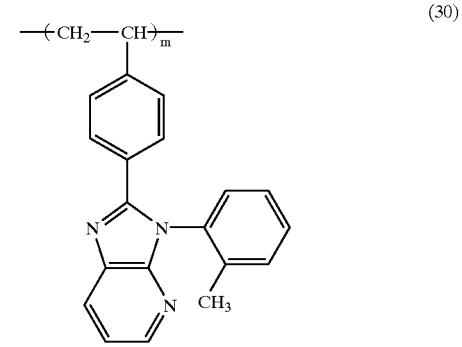
(31)
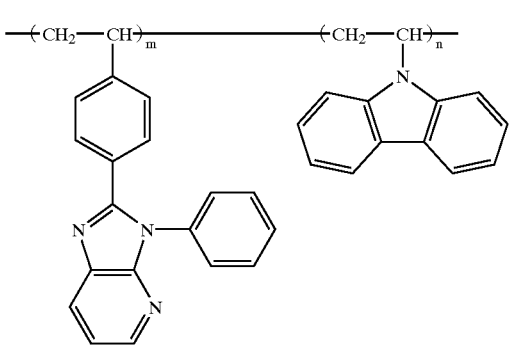
m:n = 50:50
(mole fraction)
(32)
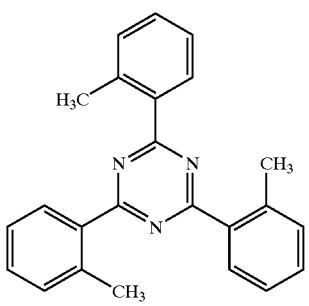

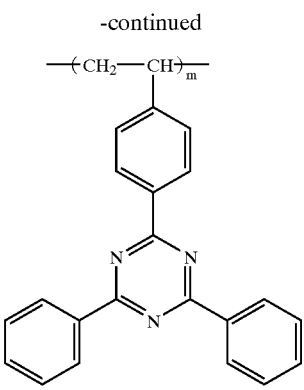

(33)

The compounds to be used in the invention represented by the formula (I) may be synthesized by making reference to the processes described in Japanese Patent Publication No. 23025/1969, Japanese Patent Publication No. 8842/1973, Japanese Patent Laid-Open No. 6331/78, Japanese Patent Laid-Open No. 92578/1998, U.S. Pat. No. 3,449,255, U.S. Pat. No. 5,766,779, J. Am. Chem. Soc., 94, 2414 (1972), Helv. Chim. Acta, 63, 413 (1980) and Liebigs Ann. Chem., 1423 (1982).

In the invention, the most preferred electron-transporting materials are those which contain a condensed imidazopyridine skeleton. Such electron-transporting materials have a minimum excitation triplet energy level within the range of 60 kcal/mol to 90 kcal/mol, an ionization potential of 5.9 eV or more, and an electron mobility of $1\times10^{-4}$ $cm^2 \cdot V^{-1} \cdot s^{-1}$ or more in the electric field of $1\times10^5$ $V \cdot cm^{-1}$, and are advantageous in that they can generate excitons with a high efficiency in the light-emitting layer and provide a high luminance and a high light-emitting efficiency.

Other components than the above-described component to be used in the electron-transporting layer are not particularly limited and may properly be selected depending upon the end use. Use of a polymer binder in the electron-transporting layer is advantageous in that the electron-transporting layer can be formed with ease and a large area by coating according to a wet filming method.

Thickness of the electron-transporting layer is preferably 10 to 200 nm, more preferably 20 to 80 nm. In case where the thickness exceeds 200 nm, driving voltage might increase whereas, in case where it is less than 10 nm, the light-emitting device might undergo short-circuit.

In the invention, the electron-transporting layer may be formed as a laminate together with an electron injecting layer. As the material for the electron injecting layer, those which can permit injection of electrons from a back side electrode or block holes injected from a transparent electrode may be used. For example, there are illustrated inorganic insulators such as aluminum oxide, lithium fluoride and cesium fluoride; n-type inorganic semiconductors such as n-type silicon and titanium dioxide; and n-type organic semiconductors such as naphthalenetetracarboxylic diimide. There are illustrated p-type inorganic semiconductors and p-type electrically conductive high polymers. The electron injecting layer has a thickness of about 1 to about 10 nm.

Positions of the organic compound layers in the light-emitting device are not particularly limited, and may properly be selected depending upon the end use of the light-emitting device. Preferably, however, the organic compound layers are formed on the transparent electrode or on the backside electrode. In such layered structure, the organic compound layers are formed all over, or part of, the surface of the transparent electrode or the back side electrode.

Shape, size and thickness of the organic compound layers are not particularly limited, and may properly be selected depending upon the end use.

The hole injecting layer and the hole-transporting layer may be formed between the light-emitting layer and the transparent electrode, and the electron injecting layer may be formed between the back side electrode to be described hereinafter and the electron-transporting layer.

As specific examples of the stratum structure of the light-emitting device, there are illustrated the following:

transparent electrode/light-emitting layer/electron-transporting layer/back side electrode;

transparent electrode/light-emitting layer/electron-transporting layer/electron injecting layer/back side electrode;

transparent electrode/hole injecting layer/light-emitting layer/electron-transporting layer/back side electrode;

transparent electrode/hole injecting layer/light-emitting layer/electron-transporting layer/electron injecting layer/back side electrode;

transparent electrode/hole injecting layer/hole-transporting layer/light-emitting layer/electron-transporting layer/electron injecting layer/back side electrode;

transparent electrode/hole-transporting layer/light-emitting layer/electron-transporting layer/back side electrode; and transparent electrode/hole-transporting layer/light-emitting layer/electron-transporting layer/electron injecting layer/back side electrode. "/" means to make distinction between layers. In every structure, light is emitted usually through the transparent electrode.

The organic compound layers may favorably be formed by any of dry filming methods such as a vapor deposition method and a sputtering method and wet filming methods such as a dipping method, a spin coating method, a dip coating method, a casting method, a die coating method, a roll coating method, a bar coating method and a gravure coating method.

With the light-emitting device of the invention, the wet filming methods for forming the organic compound layers are advantageous in that area of the organic layers can be made large with ease, and that light-emitting devices showing a high luminance and an excellent light-emitting efficiency can be obtained at a low production cost. Additionally, a proper wet filming method can be selected depending upon kind of materials to be used in the organic compound layers. In the case of filming according to the wet filming method, drying is properly conducted after forming the film. Drying conditions are not particularly limited and, for example, there may be employed a temperature within the range of not damaging the layer formed by coating.

In the case of forming the organic layers according to the wet filming method, a binder resin may be added to the organic compound layers. Such binder includes polyvinyl chloride, polycarbonate, polystyrene, polymethyl methacrylate, polybutylmethacrylate, polyester, polysulfone, polyphenylene oxide, polybutadiene, hydrocarbon resin, ketone resin, phenoxy resin, polyamide, ethyl cellulose, polyvinyl acetate, ABS resin, polyurethane, melamine resin, unsaturated polyester, alkyd resin, epoxy resin, silicone resin, polyvinyl butyral and polyvinyl acetal. These binder resins may be used independently or in combination of two or more of them.

As the substrate of the light-emitting device, materials which do not permeate moisture or which have an extremely low moisture-permeating ratio are preferred, and materials which do not scatter or damp light emitted from the organic compound layers are preferably used. For example, there are illustrated inorganic materials such as zirconia-stabilized yttrium (YSZ) and glass; and organic materials such as synthetic resins, e.g., polyesters (e.g., polyethylene terephthalate and polybutyrene terephthalate), polystyrene, polycarbonate, polyether sulfone, polyarylate, allyl diglycol carbonate, polyimide, polycycloolefin, norbornene resin and poly (chlorotrifluoroethylene). In the case of using the organic materials, those organic materials are preferred which have an excellent heat resistance, an excellent dimensional stability, an excellent solvent resistance, excellent electrically insulating properties, an excellent workability, a low permeability and a low hygroscopicity. Of these, in the case of using tin-doped indium oxide (hereinafter referred to as "ITO") which is favorably used as a material for the transparent electrode, those materials are preferred which are slightly different from ITO in lattice constant. The materials for the substrate of the light-emitting device may be used independently or in combination of two or more of them.

Shape, structure and size of the substrate are not particularly limited, and may properly be selected depending upon the end use of the light-emitting device. In general, the substrate is of a plate shape. Structure of the substrate may be either of a single-layered structure and a laminate structure, and the substrate may be formed by a single member or by two or more members. The substrate may be transparent and colorless, or transparent and colored but, in the point of not scattering or damping light emitted from the light-emitting layer, the substrate is preferably transparent and colorless.

It is preferred to provide a moisture-blocking layer (gas barrier layer) on the surface or backside (transparent electrode side) of the substrate. As materials for the moisture-blocking layer (gas barrier layer), inorganic materials such as silicon nitride and silicon oxide are preferably used. The moisture-blocking layer (gas barrier layer) may be formed by, for example, a high frequency sputtering method. If necessary, a hard coat or an undercoat may be provided on the substrate.

It usually suffices for the transparent electrode to function as an anode for feeding holes to the organic compound layers, and the transparent electrode is not particularly limited as to its shape, structure and size. A proper transparent electrode may be selected from among known electrodes depending upon the end use of the light-emitting device. The transparent electrode may function as a cathode and, in this case, the back side electrode is used as an anode.

As materials for the transparent electrode, a metal, an alloy, a metal oxide, an organic conductive compound or a mixture thereof may preferably be used. Preferable examples thereof are those materials which have a work function of 4.0 eV or more. Specific examples thereof include semi-conductive metal oxides such as ITO, tin oxide doped with antimony (ATO) or with fluorine (FTO), tin oxide, zinc oxide, indium oxide and indium zinc oxide (hereinafter abbreviated as "IZO"), metals such as gold, silver, chromium and nickel, mixtures or laminates of the metal and the conductive metal oxide, inorganic conductive materials such as copper iodide and copper sulfide, organic conductive materials such as polyaniline, polythiophene and polypyrrole, and laminates of one of these materials and ITO.

The transparent electrode may be formed on the substrate by a method properly selected, taking into consideration adaptability with the aforesaid materials, from among a wet method such as a printing method or a coating method, a physical method such as a vacuum vapor deposition method, a sputtering method or an ion plating method, and a chemical method such as a chemical vapor deposition (CVD) method or a plasma CVD method. For example, in the case of selecting ITO as a material for the transparent electrode, the transparent electrode may be formed by a direct current sputtering method, a high frequency sputtering method, a vacuum vapor deposition method or an ion plating method. In the case of selecting the organic conductive compound as a material for the transparent electrode, the transparent electrode may be formed by a wet filming method.

Position of the transparent electrode in the light-emitting device is not particularly limited, and may properly be selected depending upon the end use of the light-emitting device. Preferably, however, the transparent electrode is formed on the substrate. In such case, the transparent electrode may be formed all over the one surface of the substrate or on part of the surface.

Patterning of the transparent electrode may be conducted according to a chemical etching method by photolithography, a physical etching by laser, a vacuum vapor deposition method through a mask, a sputtering method, a lift-off method or a printing method.

Thickness of the thus obtained transparent electrode may properly be selected depending upon the kind of material and may not be specified in a general manner, but a thickness in the range of 10 nm to 50 µm is commonly employed, with a thickness of 50 nm to 20 µm being preferred. Resistance of the transparent electrode is preferably $10^3$ Ω/□ or less, more preferably $10^2$ Ω/□ or less. The transparent electrode may be transparent and colorless, or transparent and colored and, for taking out luminescence from the transparent electrode side, transparency of the transparent electrode is preferably 60% or more with 70% or more being more preferred. This transparency can be measured in a known manner using a spectrophotometer. Additionally, as to the transparent electrode, detailed descriptions are given in "Tomei Denkyokumaku-no-Sintenkai" supervized by Yutaka Sawada, and published by CMC (1999), and can be applied to the invention. In the case of using a plastic material having a low heat resistance as the substrate, a transparent electrode formed by using ITO or IZO and filming at a temperature of 150° C. or lower.

It usually suffices for the back side electrode to function as a cathode for feeding electrons to the organic compound layers, and the back side electrode is not particularly limited as to its shape, structure and size. A proper back side electrode may be selected from among known electrodes depending upon the end use of the light-emitting device. The back side electrode may function as an anode and, in this case, the transparent electrode is expected to function as a cathode.

As the materials to be used for the back side electrode, there may be illustrated metals, alloys, metal oxides, electrically conductive compounds or mixtures thereof, with those which have a work function of 4.5 eV or less being preferred. Specific examples include alkali metals (e.g., Li, Na, K and Cs), alkaline earth metals (e.g., Mg and Ca), gold, silver, lead, aluminum, sodium-potassium alloy, lithium-aluminum alloy, magnesium-silver alloy, and rare earth metals such as indium and ytterbium. These may be used independently or in combination of two or more of them. In view of obtaining both a good stability and good electron injecting properties, combined use of two or more of them is preferred. Of these, alkali metals and alkaline earth metals are preferred with respect to electron injecting properties and, from the standpoint of storage stability, a material mainly composed of aluminum is particularly preferred. The term "material mainly composed of aluminum" means 100% aluminum and an alloy or a mixture of aluminum and 0.01 to 10% by weight of an alkali metal or an alkaline earth metal (e.g., lithium-aluminum alloy and magnesium-aluminum alloy). Additionally, detailed descriptions on the materials of the back side electrode are given in Japanese Patent Laid-Open Nos. 15595/1990 and 121172/1993.

Method for forming the back side electrode is not particularly limited, and the back side electrode may be formed in a known manner. For example, the back side electrode may be formed on the substrate by a method properly selected, taking into consideration adaptability with the aforesaid materials, from among a wet method such as a printing method or a coating method, a physical method such as a vacuum vapor deposition method, a sputtering method or an ion plating method, and a chemical method such as a CVD method or a plasma CVD method. For example, in the case of selecting a metal or metals as a material for the back side electrode, the back side electrode may be formed by sputtering one, two or more kinds of them at the same time or successively.

Patterning of the back side electrode may be conducted according to a chemical etching method by photolithography, a physical etching by laser, a vacuum vapor deposition method through a mask, a sputtering method, a lift-off method or a printing method.

Position of the back side electrode in the light-emitting device is not particularly limited, and may properly be selected depending upon the end use of the light-emitting device. Preferably, however, the back side electrode is formed on the organic compound layer. In such case, the back side electrode may be formed all over the one surface of the organic compound layer or on part of the organic compound layer. In addition, a dielectric layer comprising a fluoride of an alkali metal or an alkaline earth metal having a thickness of 1 to 5 nm may be interleaved between the back side electrode and the organic compound layer. Additionally, the dielectric layer may be formed by a vacuum vapor deposition method, a sputtering method or an ion plating method.

Thickness of the back side electrode may properly be selected depending upon the kind of material and may not be specified in a general manner, but a thickness in the range of 10 nm to 5 $\mu$m is commonly employed, with a thickness of 50 nm to 1 $\mu$m being preferred. The back side electrode may be transparent or opaque. Additionally, a transparent back side electrode may be formed by filming a material for the back side electrode in a thickness of 1 to 10 nm, and laminating thereon a transparent conductive material such as ITO or IZO having been described hereinbefore.

As other layers, proper ones may properly selected with no particular limitations depending upon the end use, and there is illustrated, for example, a protective layer. As the protective layer, there are preferably illustrated those described in Japanese Patent Laid-Open Nos. 85974/1995, 192866/1995, 22891/1996, 275682/1998 and 106746/1998.

In the lamination type device, the protective layer is formed on the surface of the topmost layer. For example, in the device wherein the substrate, the transparent electrode, the organic compound layers and the back side electrode are laminated in this order, the protective layer is formed on the back side electrode and, in the device wherein the substrate, the back side electrode, the organic compound layers and the transparent electrode are formed in this order, the protective layer is formed on the transparent electrode.

Shape, size and thickness of the protective layer may properly be selected and, as materials therefor, any material may be used with no particular limitations that can prevent invasion or permeation of substances capable of deteriorating the light-emitting device, such as moisture or oxygen, into the light-emitting device. For example, there are illustrated silicon oxide, silicon dioxide, germanium oxide and germanium dioxide.

Method for forming the protective layer is not particularly limited, and there may be illustrated, for example, a vacuum vapor deposition method, a sputtering method, a reactive sputtering method, a molecular epitaxy method, a cluster ion beam method, an ion plating method, a plasma polymerization method, a plasma CVD method, a laser CVD method, a heat CVD method and a coating method.

Furthermore, in the invention, it is preferred to provide a sealing layer for the purpose of preventing invasion of moisture or oxygen into respective layers of the light-emitting device. As materials for the sealing layer, there are illustrated, for example, copolymers between tetrafluoroethylene and at least one kind of comonomer, fluorine-containing copolymers having a cyclic structure in the copolymer's main chain, polyethylene, polypropylene, polymethyl methacrylate, polyimide, polyurea, polytetrafluoroethylene, polychlorotrifluoroethylene, polydichlorodifluoroethylene, copolymers of two or more comonomers selected from among chlorotrifluoroethylene and dichlorodifluoroethylene, water-absorbing substances having a water absorption of 1% or more, moisture barrier substances having a water absorption of 0.1% or less, metals such as In, Sn, Pb, Au, Cu, Ag, Al, Tl and Ni, metal oxides such as MgO, SiO, $SiO_2$, $Al_2O_3$, GeO, NiO, CaO, BaO, $Fe_2O_3$, $Y_2O_3$ and $TiO_2$, metal fluorides such as $MgF_2$, LiF, $AlF_3$ and $CaF_2$, liquid fluorine-containing compounds such as perfluoroalkane, perfluoroamine and perfluoroether, and dispersions of an adsorbent capable of adsorbing moisture or oxygen in the liquid fluorine-containing compound.

In the invention, the light-emitting device is preferably sealed by a sealing plate or a sealing vessel using a sealing agent for the purpose of preventing contact without side moisture or oxygen. As materials to be used for the sealing plate or the sealing vessel, there may be used glass, metals such as stainless steel and aluminum, plastics such as poly(chlorotrifluoroethylene), polyester and polycarbonate, and ceramics. As the sealing agent, any of UV ray-curing resins, thermosetting resins and two-pack type setting resins may be used.

Further, in the invention, a moisture absorbent or an inert liquid may be provided in the space between the sealing vessel and the light-emitting device. The moisture absorbent is not particularly limited, but may be exemplified by barium oxide, sodium oxide, potassium oxide, calcium oxide, sodium sulfate, calcium sulfate, magnesium sulfate, phosphorus pentoxide, calcium chloride, magnesium chloride, copper chloride, cesium fluoride, niobium fluoride, calcium bromide, vanadium bromide, molecular sieve, zeolite and magnesium oxide. The inert liquid is not particularly limited, but may be exemplified by paraffins, liquid paraffins, fluorine-containing solvents such as perfluoroalkanes, perfluoroamines and perfluoroethers, chlorine-containing solvents, and silicone oils.

The light-emitting device of the invention emits light when a direct current volt (an alternating current component being optionally contained, if necessary) (usually 2 V to 40 V) or a direct current is applied across the transparent electrode and the back side electrode. As to methods of driving the light-emitting device of the invention, those methods may be utilized which are described in Japanese Patent Laid-Open Nos. 148687/1990, 301355/1994, 29080/

1993, 134558/1995, 234685/1996 and 241047/1996, U.S. Pat. Nos. 5,828,429 and 6,023,308 and Japanese Patent No. 2784615.

EXAMPLES

The light-emitting device of the invention is described by reference to Examples which, however, are not to be construed as limitative at all.

Example 1

An ITO thin film (0.2 $\mu$m in thickness) was formed as a transparent electrode on a substrate of 0.5-mm thick glass plate by introducing the substrate into a vacuum chamber and conducting sputtering using an ITO target having a $SnO_2$ content of 10% by weight (indium:tin=95:5 in molar ratio) and using a DC magnetron sputter (conditions: 250° C. in substrate temperature and $1\times10^{-3}$ Pa in oxygen pressure). The ITO thin film had a surface resistance of 10 $\Omega/\square$.

Next, the glass substrate having formed thereon the transparent electrode was placed in a washing vessel, and washed with isopropyl alcohol (IPA), followed by oxygen plasma treatment. Then, a dispersion of poly(ethylenedioxythiophene)-polystyrenesulfonic acid in water (made by BAYER; Baytron P; content of solids: 1.3% by weight) was spin coated on the surface of the transparent electrode, followed by drying in vacuo at 150° C. for 2 hours to form a 100-nm thick hole injecting layer.

On this hole injecting layer was coated a coating solution using a spin coater, the coating solution being obtained by dissolving in dichloroethane polyvinylcarbazole (Mw=63000; made by Aldritch) as hole-transporting material and host material and tris(2-phenylpyridine)iridium complex as orthometallated complex in a weight ratio of 40:1, followed by drying at room temperature to form a 40-nm thick light-emitting layer.

On this light-emitting layer was then coated a coating solution using a spin coater, the coating solution being obtained by dissolving in 1-butanol polyvinylbutyral (Mw=50000; made by Aldritch) and the illustrative compound 27 as an electron-transporting material in a weight ratio of 10:20, followed by drying in vacuo at 80° C. for 2 hours to form a 60-nm thick electron-transporting layer. A patterned mask (mask for adjusting light-emitting area to be 5 mm×5 mm) was placed on the electron-transporting layer, and 0.25-$\mu$m thick vacuum deposition of magnesium:silver=10:1 (molar ratio) was conducted in a vacuum deposition apparatus, followed by further vacuum depositing silver in a thickness of 0.3 $\mu$m to provide a back side electrode. Aluminum lead wires were connected to the transparent electrode (functioning as anode) and the back side electrode (functioning as cathode), respectively, to prepare a laminate structure. The thus obtained laminate structure was placed in a nitrogen gas-replaced globe box, and sealed by a glass-made sealing vessel using a UV ray-curing adhesive (made by Nagase Ciba; XNR5493). Thus, there was prepared a light-emitting device of Example 1.

The light-emitting device was evaluated in the following manner. A direct current voltage was applied to the organic EL device to emit light using a source measure unit, Model 2400, made by Toyo Technica Co. Maximum luminance was represented as $L_{max}$, and the voltage giving Lmax was represented as $V_{max}$. Light-emitting efficiency upon 200 cd/m² was represented as ($\eta 200$), and light-emitting efficiency upon 2000 cd/m2 was represented as external quantum efficiency ($\eta 2000$) Results are shown in Table 1.

TABLE 1

|  | $L_{max}$ (cd/m²) | $V_{max}$ (V) | $\eta_{200}$ (%) | $\eta_{2000}$ (%) |
|---|---|---|---|---|
| Example 1 | 78000 | 15 | 12.5 | 11.8 |
| Example 2 | 96000 | 10 | 18.9 | 15.4 |
| Example 3 | 87000 | 12 | 17.9 | 14.0 |
| Example 4 | 88000 | 13 | 17.8 | 13.8 |
| Example 5 | 78000 | 14 | 16.8 | 14.2 |
| Example 6 | 85000 | 15 | 13.7 | 13.5 |
| Example 7 | 98000 | 10 | 18.4 | 16.1 |
| Example 8 | 86000 | 11 | 17.3 | 15.9 |
| Example 9 | 105000 | 18 | 20.0 | 17.0 |
| Reference Example 1 | 12000 | 17 | 5.2 | 1.8 |
| Reference Example 2 | 23000 | 18 | 1.2 | 0.7 |

Minimum excitation triplet energy level of each material was determined using a sample obtained by dissolving a binder polymer of PMMA and the electron-transporting material in a ratio of 50:50 (% by weight) in dichloroethane and coating the solution in a thickness of about 0.1$\mu$ on a glass. The sample was cooled to the temperature of liquid nitrogen and subjected to measurement of phosphorescence (FLUOROGII; made by SPEC), and the energy level was determined from the build-up wavelength. Results thus obtained are shown in Table 2.

TABLE 2

| Compound | | Minimum Excitation Triplet Enery Level (kcal/mol) | Ionization Potential (eV) | Electron Mobility (cm² · V · s⁻¹) |
|---|---|---|---|---|
| Ex. 1 | Illustrative Compound 27 | 66 | 6.3 | $2 \times 10^{-3}$ |
| Ex. 3 | Illustrative Compound 24 | 67 | 6.4 | $2 \times 10^{-3}$ |
| Ex. 4 | Illustrative Compound 29 | 65 | 6.3 | $1 \times 10^{-3}$ |
| Ex. 5 | Illustrative Compound 32 | 62 | 6.0 | $5 \times 10^{-4}$ |
| Ex. 8 | Illustrative Compound 22 | 63 | 6.1 | $4 \times 10^{-4}$ |
| Reference Ex. 1 | Alq | 58 | 5.8 | $1 \times 10^{-5}$ |

Ionization potential of each sample was measured in the atmosphere using a UV ray-photoelectron analyzer AC-1 (made by Riken Keiki K.KI.). Results thus obtained are also shown in Table 2. Electron mobility of each sample was determined according to the time-of-flight method using a sample prepared by dissolving a binder polymer of PMMA and the electron-transporting material in a ratio of 20:80 (% by weight) applying the coating solution in a thickness of about 1$\mu$ to a glass having provided thereon ITO, and vapor depositing platinum on the coat. Additionally, electric field was $1\times10^5$ V·cm⁻¹. Results thus obtained are also shown in Table 2.

Example 2

A light-emitting device was prepared and evaluated in the same manner as in Example 1 except for forming the electron-transporting layer (60 nm) by the method of vacuum-depositing the illustrative compound 27 as an electron-transporting material. Results thus obtained are shown in Table 1.

Example 3

A light-emitting device was prepared and evaluated in the same manner as in Example 1 except for forming the electron-transporting layer by using the illustrative compound 24 as an electron-transporting material in place of the illustrative compound 27 used in Example 2. Results thus obtained are shown in Tables 1 and 2.

Example 4

A light-emitting device was prepared and evaluated in the same manner as in Example 1 except for forming the electron-transporting layer by using the illustrative compound 29 as an electron-transporting material in place of the illustrative compound 27 used in Example 2. Results thus obtained are shown in Tables 1 and 2.

Example 5

A light-emitting device was prepared and evaluated in the same manner as in Example 1 except for forming the electron-transporting layer by using the illustrative compound 32 as an electron-transporting material in place of the illustrative compound 27 used in Example 2. Results thus obtained are shown in Tables 1 and 2.

Example 6

A light-emitting device was prepared and evaluated in the same manner as in Example 1 except for using N,N'-bis(3-methylphenyl)-N,N'-diphenylbenzidine as a hole-transporting material in place of polyvinylcarbazole, 4,4'-N,N'-dicarbazolebiphenyl (CBP) as a host in place of polyvinylcarbazole, tris(2-phenylpyridine)iridium complex as an orthometallated complex, and polymethyl methacrylate (Mw=120000; made by Aldritch) as a polymer binder, dissolving them in dichloromethane in a ratio of 10:20:1:10 by weight, coating the resulting coating solution by means of a spin coater to form a 40-nm thick light-emitting layer. Results thus obtained are shown in Table 1.

Example 7

A light-emitting device was prepared and evaluated in the same manner as in Example 1 except for forming the electron-transporting layer (60 nm) by the vacuum deposition method using the illustrative compound 27 used in Example 6 as an electron-transporting material. Results thus obtained are shown in Table 1.

Example 8

A light-emitting device was prepared in the same manner as in Example 7 except for forming the electron-transporting layer by using the illustrative compound 22 as an electron-transporting material in place of the illustrative compound 27. Results thus obtained are shown in Table 1 and Table 2.

Example 9

An ITO-provided substrate was washed in the same manner as in Example 1, N,N'-diphenyl-N,N'-di(m-tolyl)benzidine (TPD) was vapor deposited thereon to a thickness of 40 nm, 4,4'-bis(carbazoy-9-yl)biphenyl and tris(2-phenylpyridine)iridium (III) were vapor codeposited thereon at vapor deposition rates of 0.4 nm/sec and 0.025 nm/sec, respectively, to a thickness of 20 nm, then the illustrative compound 27 was vapor deposited thereon to a thickness of 40 nm, followed by vapor depositing LiF ($1.0 \times 10^{-3}$ to $1.3 \times 10^{-3}$ Pa) to a thickness of 1 nm. A patterned mask (mask for adjusting light-emitting area to be 4 mm×5 mm) was placed thereon, and aluminum was vapor deposited to a thickness of 200 nm ($1.0 \times 10^{-3}$ to $1.3 \times 10^{-3}$ Pa) to prepare a device. Results are shown in Table 1.

Reference Example 1

A light-emitting device was prepared in the same manner as in Example 2 except for using as an electron-transporting material hydroxyquinoline aluminum complex (Alq) in place of the illustrative compound 27, and was evaluated in the same manner as in Example 1. Results thus obtained are tabulated in Table 1 and Table 2.

Additionally, in Reference Example 1, Alq had a minimum excitation triplet energy level of 58 kcal/mol, an ionization potential of 5.8 eV, and an electron mobility of $2 \times 10^{-5}$ $cm^2 \cdot V^{-1} \cdot s^{-1}$. As a result, the device showed a low light-emitting efficiency and a low light-emitting luminance.

Reference Example 2

A light-emitting device was prepared and evaluated in the same manner as in Example 1 except for using coumarin 6 in place of the orthometallated complex of tris(2-phenylpyridine)iridium complex. Results thus obtained are tabulated in Table 1. The element showed a low light-emitting efficiency and a low light-emitting luminance due to the absence of the orthometallated complex in the light-emitting layer.

According to the invention, a light-emitting device excellent in light-emitting efficiency and light-emitting luminance is provided by using an electron-transporting material having a specified minimum excitation triplet energy level, ionization potential and electron mobility in forming a laminated two- or three-layered structure. In addition, since a phosphorescent compound is incorporated, there is obtained a light-emitting device showing a high light-emitting efficiency and a high light-emitting luminance. In the case of at least one of the organic compound layers being able to be formed by a wet filming method, the light-emitting device can be produced at a lower production cost.

Although the invention has been described with respect to specific embodiments, the details are not to be construed as limitations, for it will become apparent that various embodiments, changes and modifications may be resorted to without departing from the spirit and scope thereof, and it is understood that such equivalent embodiments are intended to be included within the scope of this invention.

The entire disclosure of each and every foreign patent application from which the benefit of foreign priority has been claimed in the present application is incorporated herein by reference, as if fully set forth.

What is claimed is:

1. A light-emitting device comprising:
   a pair of electrodes formed on a substrate; and
   organic compound layers provided in between the electrodes,
   wherein the organic compound layers comprise a light-emitting layer comprising a hole-transporting material and a phosphorescent compound and an electron-transporting layer comprising an electron-transporting material, and an ionization potential of the electron-transporting material is 5.9 eV or more; and wherein the electron-transporting material is at least one of an aromatic heterocyclic compound which has a triazine skeleton.

2. The light-emitting device according to claim 1, wherein a minimum excitation triplet energy level of the electron-transporting material is from 60 kcal/mol to 90 kcal/mol.

3. The light-emitting device according to claim 1, wherein an electron mobility of the electron-transporting material is $1\times10^{-4}$ cm$^2\cdot$V$^{-1}\cdot$s$^{-1}$ or more in an electric field of $1\times10^5$ V$\cdot$cm$^{-1}$.

4. The light-emitting device according to claim 1, wherein the content of the electron-transporting material is from 20 to 100% by weight based on the total content of the electron-transporting layer.

5. The light-emitting device according to claim 1, wherein at least one of the organic compound layers is formed by a coating method.

6. The light-emitting device according to claim 1, wherein the phosphorescent compound comprises one of orthometallated metal complex and porphyrin metal complex.

7. The light-emitting device according to claim 6, wherein the orthometallated metal complex comprises one of rhodium, platinum, gold, iridium, ruthenium and palladium.

8. The light-emitting device according to claim 1, wherein the content of the phosphorescent compound is from 0.1 to 70% by weight based on the total content of the light-emitting layer.

9. A light-emitting device comprising:

a pair of electrodes formed on a substrate; and organic compound layers provided in between the electrodes;

wherein the organic compound layers comprises a hole-transporting layer comprising a hole-transporting material, a light-emitting layer comprising a phosphorescent compound and an electron-transporting layer comprising an electron-transporting material, and an ionization potential of the electron-transporting material is 5.9 eV or more; and wherein the electron-transporting material is at least one of an aromatic heterocyclic compound which has a triazine skeleton.

10. The light-emitting device according to claim 9, wherein a minimum excitation triplet energy level of the electron-transporting material is from 60 kcal/mol to 90 kcal/mol.

11. The light-emitting device according to claim 9, wherein an electron mobility of the electron-transporting material is $1\times10^{-4}$ cm$^2\cdot$V$^{-1}\cdot$s$^{-1}$ or more in an electric field of $1\times10^5$ V$\cdot$cm$^{-1}$.

12. The light-emitting device according to claim 9, wherein the content of the electron-transporting material is from 20 to 100% by weight based on the total content of the electron-transporting layer.

13. The light-emitting device according to claim 9, wherein at least one of the organic compound layers is formed by a coating method.

14. The light-emitting device according to claim 9, wherein the phosphorescent compound comprises one of orthometallated metal complex and porphyrin metal complex.

15. The light-emitting device according to claim 14, wherein the orthometallated metal complex comprises one of rhodium, platinum, gold, iridium, ruthenium and palladium.

16. The light-emitting device according to claim 9, wherein the content of the phosphorescent compound is from 0.1 to 70% by weight based on the total content of the light-emitting layer.

* * * * *